United States Patent
Hidaka et al.

(10) Patent No.: US 9,349,739 B2
(45) Date of Patent: May 24, 2016

(54) OTP MEMORY

(71) Applicant: Renesas Electronics Corporation, Kanagawa (JP)

(72) Inventors: Kenichi Hidaka, Kanagawa (JP); Yoshitaka Kubota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/791,913

(22) Filed: Jul. 6, 2015

(65) Prior Publication Data

US 2015/0311216 A1 Oct. 29, 2015

Related U.S. Application Data

(63) Continuation of application No. 13/584,899, filed on Aug. 14, 2012, now Pat. No. 9,105,338.

(30) Foreign Application Priority Data

Sep. 5, 2011 (JP) .................................. 2011-192823

(51) Int. Cl.
*G11C 7/00* (2006.01)
*H01L 27/112* (2006.01)
*G11C 17/16* (2006.01)
*G11C 17/18* (2006.01)
*H01L 49/02* (2006.01)

(52) U.S. Cl.
CPC .......... *H01L 27/11206* (2013.01); *G11C 17/16* (2013.01); *G11C 17/18* (2013.01); *H01L 28/40* (2013.01)

(58) Field of Classification Search
CPC . G11C 11/407; G11C 2216/26; G11C 29/822
See application file for complete search history.

(56) References Cited

U.S. PATENT DOCUMENTS

| | | | |
|---|---|---|---|
| 5,402,373 A | 3/1995 | Aritome et al. | |
| 6,344,996 B2 * | 2/2002 | Tanak | 365/185.05 |
| 6,424,557 B2 * | 7/2002 | Camera | 257/E21.526 |
| 6,667,902 B2 | 12/2003 | Peng | |
| 6,798,693 B2 | 9/2004 | Peng | |
| 6,993,691 B2 * | 1/2006 | Ogiwara | G11C 11/22 365/145 |
| 2003/0103400 A1 | 6/2003 | Van Tran | |
| 2004/0027877 A1 | 2/2004 | Kotz et al. | |
| 2007/0030735 A1 | 2/2007 | Crippa et al. | |

FOREIGN PATENT DOCUMENTS

| | | |
|---|---|---|
| JP | 2005-504434 A | 2/2005 |
| JP | 2010-103563 A | 5/2010 |
| WO | 03/025944 A1 | 3/2003 |

* cited by examiner

*Primary Examiner* — Tuan T Nguyen
(74) *Attorney, Agent, or Firm* — Sughrue Mion, PLLC

(57) ABSTRACT

The present invention provides an OTP memory having higher confidentiality. A memory cell has a memory transistor forming a current path between first and second nodes, a selection transistor forming a current path between third and fourth nodes, the third node being coupled to the gate of the memory transistor via a line, and a capacitor coupled to the first node. By applying high voltage which does not break but deteriorates a gate oxide film and increases gate leak current to a memory transistor, data is written. Data can be read by the presence/absence of leak of charges accumulated in the capacitor. Since the position of deterioration in the gate oxide film cannot be discriminated by a physical analysis, confidentiality is high.

2 Claims, 16 Drawing Sheets

OTP MEMORY

CROSS-REFERENCE TO RELATED APPLICATIONS

This is a continuation of U.S. application Ser. No. 13/584,899, filed on Aug. 14, 2012, which claims priority from Japanese Patent Application No. 2011-192823 filed on Sep. 5, 2011 the disclosure of which is incorporated herein in its entirety by reference.

BACKGROUND

The present invention relates to an OTP (One Time Programmable) memory.

To store confidential information (for example, key information for encryption of an STB (Set Top Box)), an OTP memory is used. In such an OTP memory, as described in patent literatures 1 to 3, an anti-fuse of a gate oxide film breakdown type is used to record data.

As a reference technique, FIG. 1 shows an example of a cross section of an OTP memory. One memory cell isolated by a device isolation region 102 is drawn. An NMOS transistor (selection transistor 110) is coupled to an NMOS gate capacitance (fuse 111) via a diffusion layer. A thin gate oxide film 108 (having a thickness of, for example, less than 5 nm) is formed for the fuse 111 and a thick gate oxide film 107 (having a thickness of, for example, over 5 nm) is formed for the selection transistor.

By applying high voltage Vpp ($\geq$ gate oxide film breakdown voltage, for example, 7V) to a fuse gate 106, voltage Vdd_high ($\geq$Vdd, for example, 2.5V) to a selection transistor gate 105, and 0V to a diffusion layer 103 on the selection transistor side, the gate oxide film 108 of the fuse is broken and information is written. At the time of reading the information, Vdd (for example, 1.5V) is applied to the fuse gate 106 (the others are similar to the above). Current is passed to a cell in which the gate oxide film is broken and no current is passed to a cell in which the gate oxide film is not broken, thereby reading information.

FIG. 2 shows an array configuration of the OTP memory and voltage relations at the time of writing. Information is written in a cell C11 since the potential of the fuse gate 106 is Vpp and the potential of the selection transistor gate 105 is Vdd_high. Information cannot be written in a cell C21 for a reason that Vpp is not applied to the fuse gate 106. In a cell C12, the potential of the selection transistor gate 105 is 0V and breakdown current does not sufficiently flow via the selection transistor 110, so that the gate oxide film is not broken. Information cannot be written in a cell C22 for a reason that both of the potential of the fuse gate 106 and the potential of the selection transistor gate 105 are 0V. Therefore, information can be selectively written only in desired cells.

FIG. 3 shows voltage relations at the time of reading. The relations are similar to those at the time of writing except that the potential of the fuse gate 106 is Vdd, and data in desired cells can be selectively read.

RELATED ART LITERATURE

Patent Literature

Patent Literature 1

Japanese Examined Patent Application Publication No. 2005-504434

Patent Literature 2

Japanese Unexamined Patent Publication No. 2010-103563

Patent Literature 3

U.S. Pat. No. 6,798,693

SUMMARY

In the OTP memory, information is written by breaking the gate oxide film of the anti-fuse of the gate oxide film breakdown type. By breaking the gate oxide film, an Si filament is formed between the gate and a substrate. By performing a physical analysis (such as TEM) on the Si filament, the broken part in the gate oxide film can be specified. That is, there is the possibility that confidential information recorded on the OTP memory is decoded by a physical analysis. Thus, an OTP memory having higher confidentiality is in demand.

In one aspect of the present invention, a memory cell for an OTP (One Time Programmable) memory includes: a memory transistor as an MIS transistor forming a current path between first and second nodes in accordance with voltage applied to a gate; a selection transistor as an MIS transistor forming a current path between third and fourth nodes in accordance with voltage applied to a gate, the third node being coupled to the gate via a line; and a capacitor whose one of electrodes is coupled to the first node.

In the memory having such a configuration, data is written by applying voltage to increase gate leak current without breaking the gate oxide film to the memory transistor, and data is read according to the presence/absence of leak of charges accumulated in the capacitor.

In another aspect of the present invention, an OTP (One Time Programmable) memory includes: a plurality of bit lines; a plurality of word lines; a plurality of capacitor lines disposed in correspondence with the plurality of word lines in a one-to-one corresponding manner; and a plurality of memory cells disposed at cross points of the plurality of bit lines and the plurality of word lines. Each of the plurality of memory cells includes: a memory transistor as an MIS transistor forming a current path between first and second nodes in accordance with voltage applied to a gate; a selection transistor as an MIS transistor forming a current path between third and fourth nodes in accordance with voltage applied to a gate, the third node being coupled to the gate via a line; and a capacitor whose one of electrodes is coupled to the first node. The second node is coupled to a corresponding bit line in the plurality of bit lines. The gate of the selection transistor is coupled to a corresponding word line in the plurality of word lines. The other electrode of the capacitor is coupled to a corresponding capacitor line in the plurality of capacitor lines. The fourth node is coupled to a corresponding sub-word line in the plurality of sub-word lines.

In further another aspect of the present invention, a data writing method of writing binary data taking either a first value or a second value to each of a plurality of memory cells in the OTP memory of the present invention is provided. Only on a memory cell to which the first value is written in the plurality of memory cells, the following steps are executed, of applying voltage Vpp' to increase leak current of a gate oxide film across the second node and the gate of the memory transistor; applying voltage Vdd_high smaller than the voltage Vpp' to the gate of the selection transistor; applying 0V to the fourth node; and applying 0V to the other electrode of the capacitor.

In further another aspect of the present invention, a method of reading data written in each of a plurality of memory cells included in the OTP memory according to the present invention is provided. The data reading method includes the steps of: applying voltage Vdd equal to or lower than voltage Vdd_high to the second node; applying the voltage Vdd_high to the gate of the selection transistor; applying the voltage Vdd to the fourth node; applying 0V to the other electrode of the capacitor; and sensing data in accordance with potential of the second node.

In further another aspect of the present invention, a method of reading data written in each of a plurality of memory cells included in the OTP memory according to the present invention is provided. The data reading method includes the steps of: applying 0V to the second node; applying the voltage Vdd_high to the gate of the selection transistor; applying a voltage Vdd equal to or smaller than the voltage Vdd_high to a fourth node; and applying the voltage Vdd to the other electrode of the capacitor.

According to the present invention, an OTP memory having higher confidentiality can be provided.

DETAILED DESCRIPTION

Figure 1:
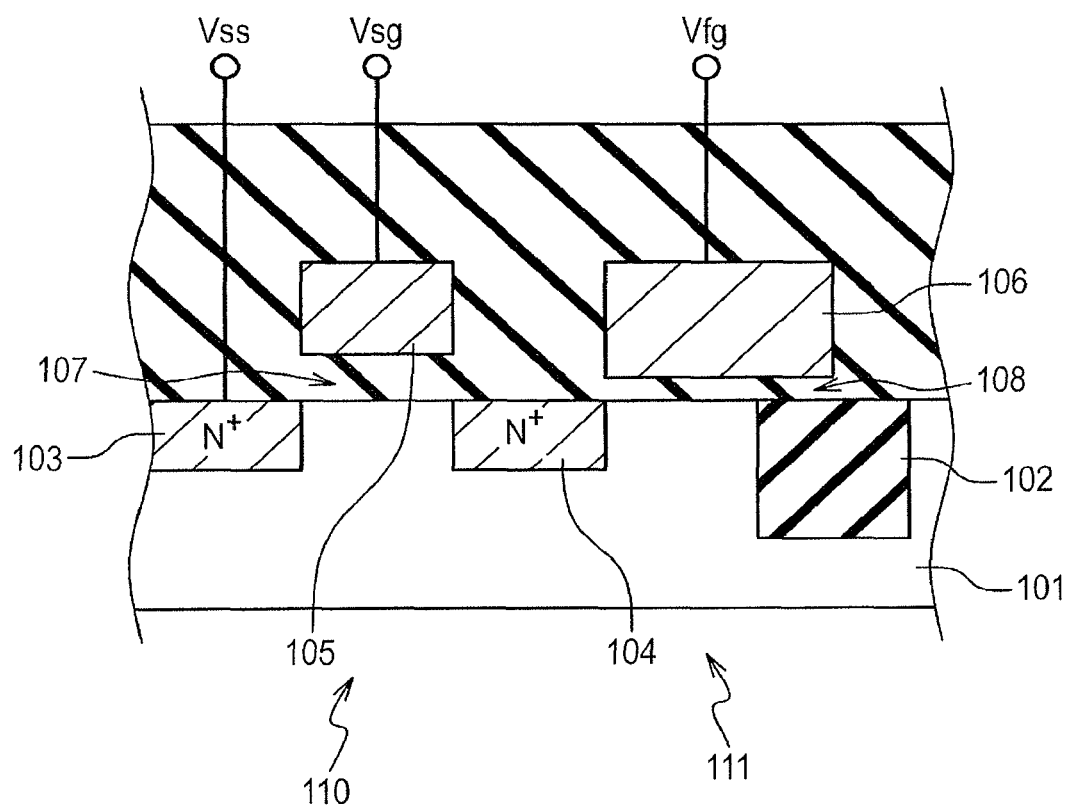
FIG. 1 illustrates a device structure of a memory cell in a reference technique.
Figure 2:
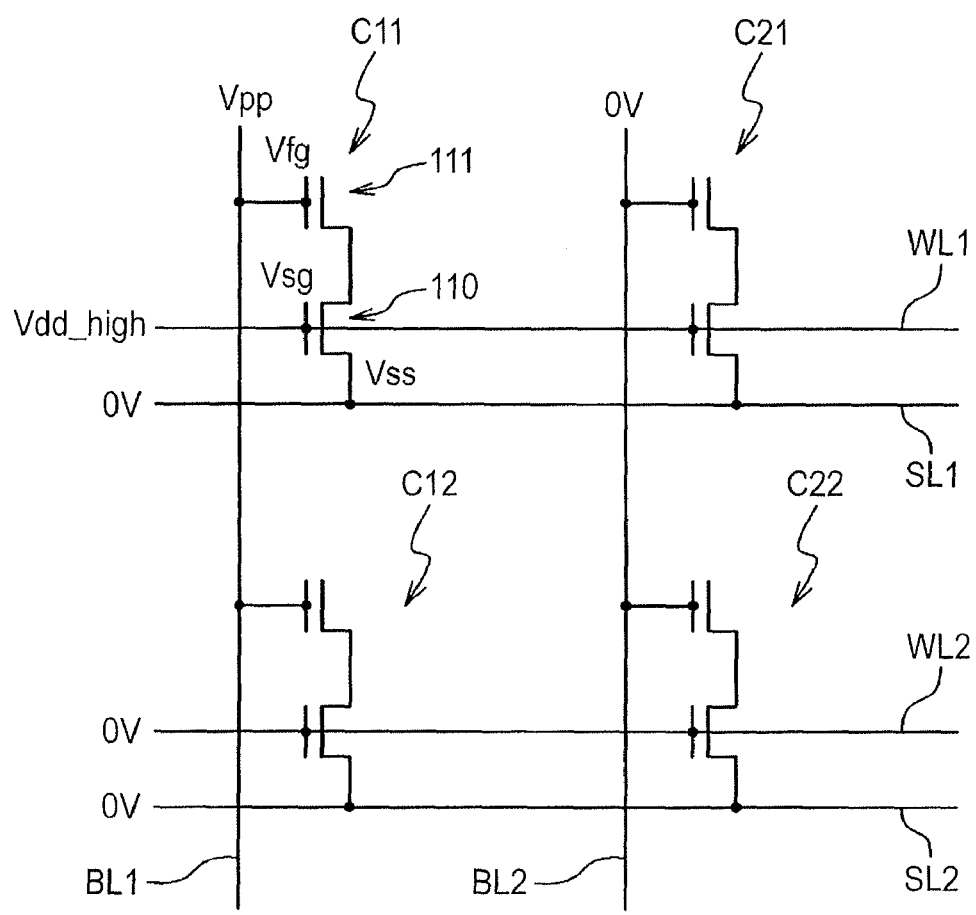
FIG. 2 shows an array configuration of a memory and voltage relations at the time of writing in a reference technique.
Figure 3:
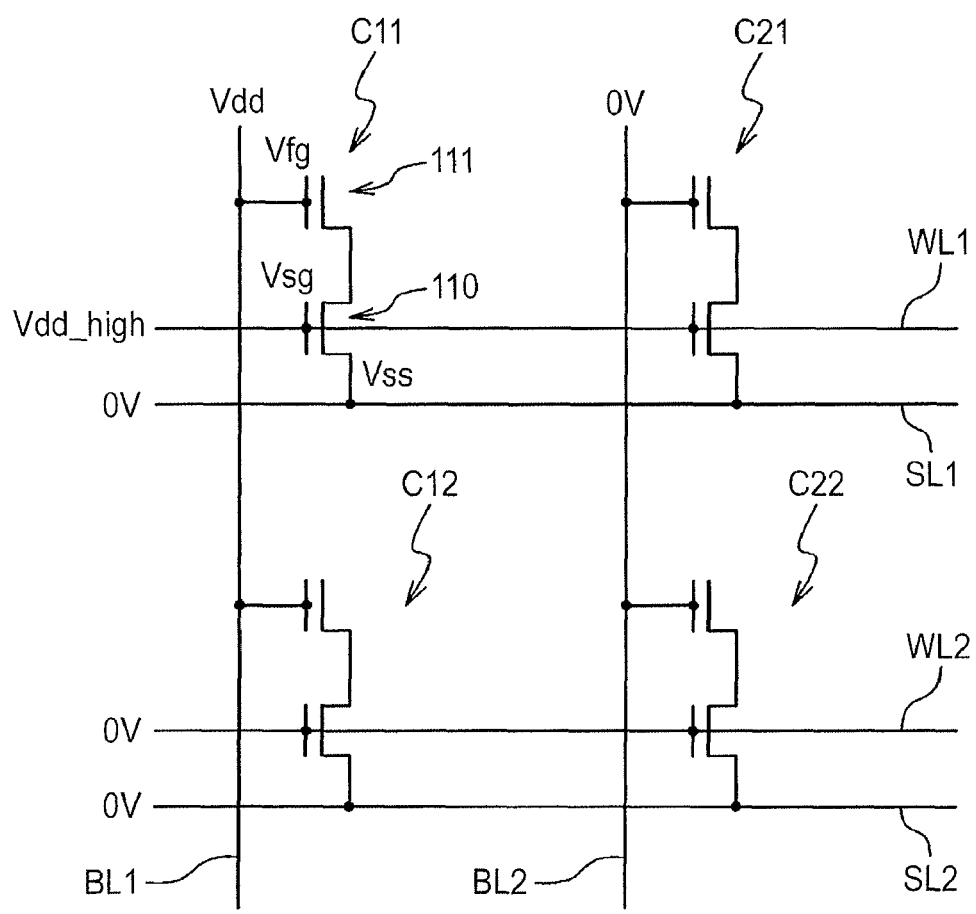
FIG. 3 shows voltage relations at the time of reading in a reference technique.
Figure 4:
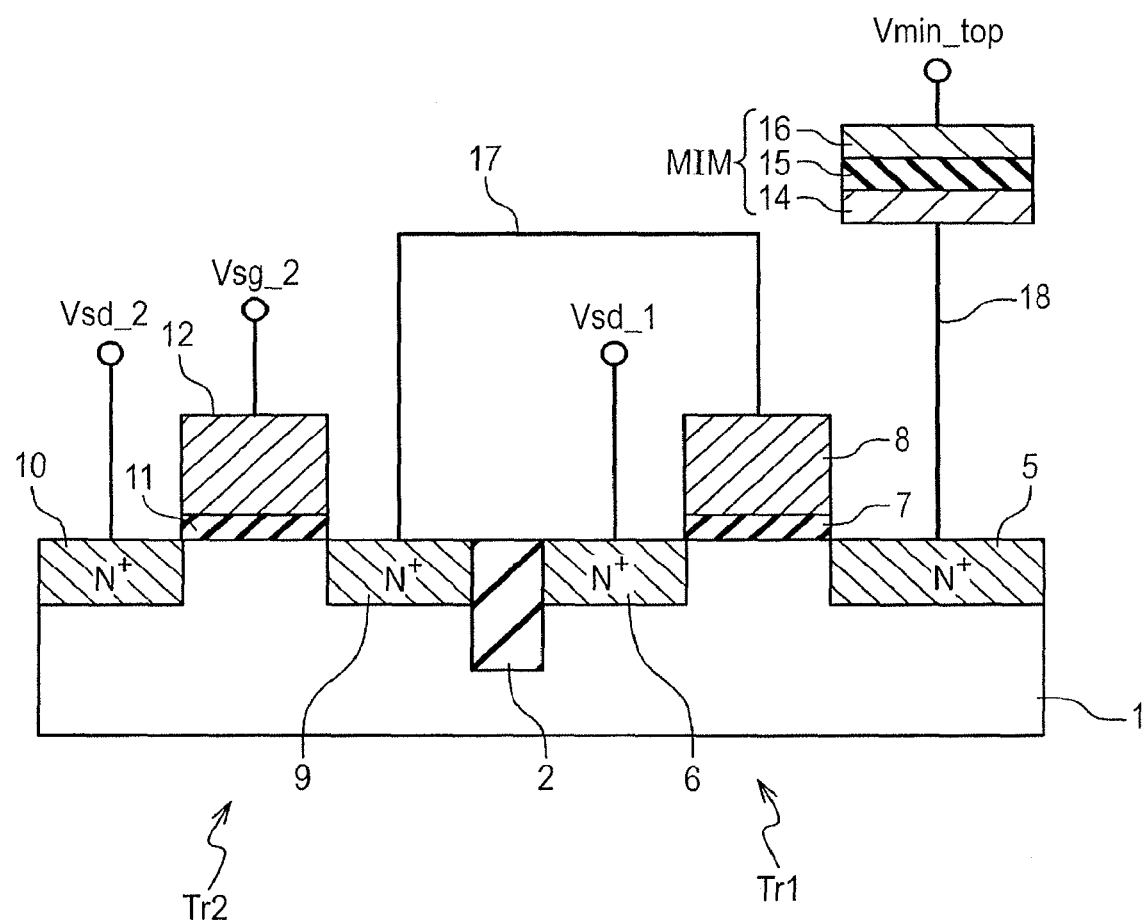
FIG. 4 shows a device structure of a memory cell in an embodiment.

Hereinafter, referring to the attached drawings, embodiments of the present invention will be described. FIG. 4 is a cross section showing a memory cell in an OTP memory device in an embodiment of the present invention. A memory cell has two NMIS (N-type Metal-Insulator Semiconductor) transistors (a first selection transistor Tr1 and a second selection transistor Tr2) and one capacitor MIM. In the following description, it is assumed that the MIS transistor has a MOS (Metal Oxide Semiconductor) structure. A source diffusion layer 9 of the second selection transistor Tr2 is coupled to a gate 8 of the first selection transistor Tr1 via a line 17. A bottom plate 14 of the capacitor MIM is coupled to a source diffusion layer 5 of the first selection transistor Tr1. The first selection transistor Tr1 has the source diffusion layer 5 as a first node and a drain diffusion layer 6 as a second node. According to voltage applied to the gate 8, a current path is formed between the first and second nodes. The second selection transistor Tr2 has the source diffusion layer 9 as a third node and a drain diffusion layer 10 as a fourth node. According to voltage applied to a gate 12, a current path is formed between the third and fourth nodes.

The capacitor MIM is a capacitive element of a Metal-Insulator-Metal type in which a metal layer of a top plate 16 and a metal layer of the bottom plate 14 are opposed to each other via an insulating layer 15. In place of such a capacitor, for example, a capacitor having a polysilicon-insulator-polysilicon stack structure may be used. In the case of forming the OTP memory on, for example, the same silicon chip as a DRAM, the OTP memory having the MIM-type capacitor is preferable since the capacitor can be formed in the same process as the DRAM.

A gate insulating film 7 made by, for example, an oxide film of the first selection transistor Tr1 and a gate insulating film 11 made by, for example, an oxide film of the second selection transistor Tr2 are thin (for example, less than 5 nm). By applying high voltage across the gate and drain of the first selection transistor Tr1, gate insulating film leak of the first selection transistor Tr1 can be increased. According to the presence or absence of increase in leak current, data can be written.

In such a device, different from an OTP memory in which data is written by breaking the gate insulating film, a leak part in the gate insulating film as a change point after writing cannot be determined by a physical analysis. Consequently, for example, even in the case where a discarded semiconductor product is obtained, it is difficult to decode confidential information stored in the OTP memory. Thus, an OTP memory having high confidentiality can be manufactured.

Hereinafter, the embodiment will be described more specifically. The first selection transistor Tr1 is used for selecting a memory cell and functions as a memory transistor for storing data. Each of the gate insulating film in the first selection transistor Tr1 and that in the second selection transistor Tr2 is a thin oxide film for, for example, a core transistor and has a thickness of about 2 nm.

A high voltage Vpp' is applied to the drain diffusion layer 6 of the first selection transistor Tr1. The value of the high voltage Vpp' is smaller than the breakdown voltage of the gate insulating film and is, for example, 3V to 4V. Simultaneously, Vdd_high (≥Vdd, for example, about 2V) is applied to the gate 12 of the second selection transistor Tr2, 0V is applied to the drain diffusion layer 10, and 0V is applied to the top plate 16 of the capacitor MIM. As a result, Vpp' is applied across the gate and the drain of the first selection transistor Tr1.

By the application of Vpp' across the gate and the drain of the first selection transistor Tr1, the gate insulating film 7 deteriorates and gate leak current increases. When the gate leak current increases by more than one digit, after predetermined time, charges accumulated in the capacitor MIM escape to the source diffusion layer 9 of the second selection transistor Tr2 and cannot be held. Therefore, by discriminating whether the charges are held in the capacitor MIM or not after lapse of the predetermined time since charges are accumulated in the capacitor MIM, whether the gate insulating film 7 deteriorates or not can be recognized. That is, by whether the gate insulating film 7 deteriorates or not, information of one bit can be stored. To enable such writing, a semiconductor product on which the OTP memory is mounted is provided with a terminal for applying the voltage Vpp' from the outside.

In each of the memory cells in the OTP memory, information of one bit (binary data of either a first value or a second value) can be recorded by the above-described means. For example, it is assumed that each of the memory cells prior to execution of the writing operation on the OTP memory corresponds to the second value. By adding the above-described voltage Vpp' only to a memory cell to which the first value is instructed to be written, in the OTP memory, the gate insulating film 7 deteriorates and data is written. In the following description, it is assumed that a state where the gate insulating film 7 does not deteriorate corresponds to "0" and a state where the gate insulating film 7 deteriorates corresponds to "1".

Figure 5:
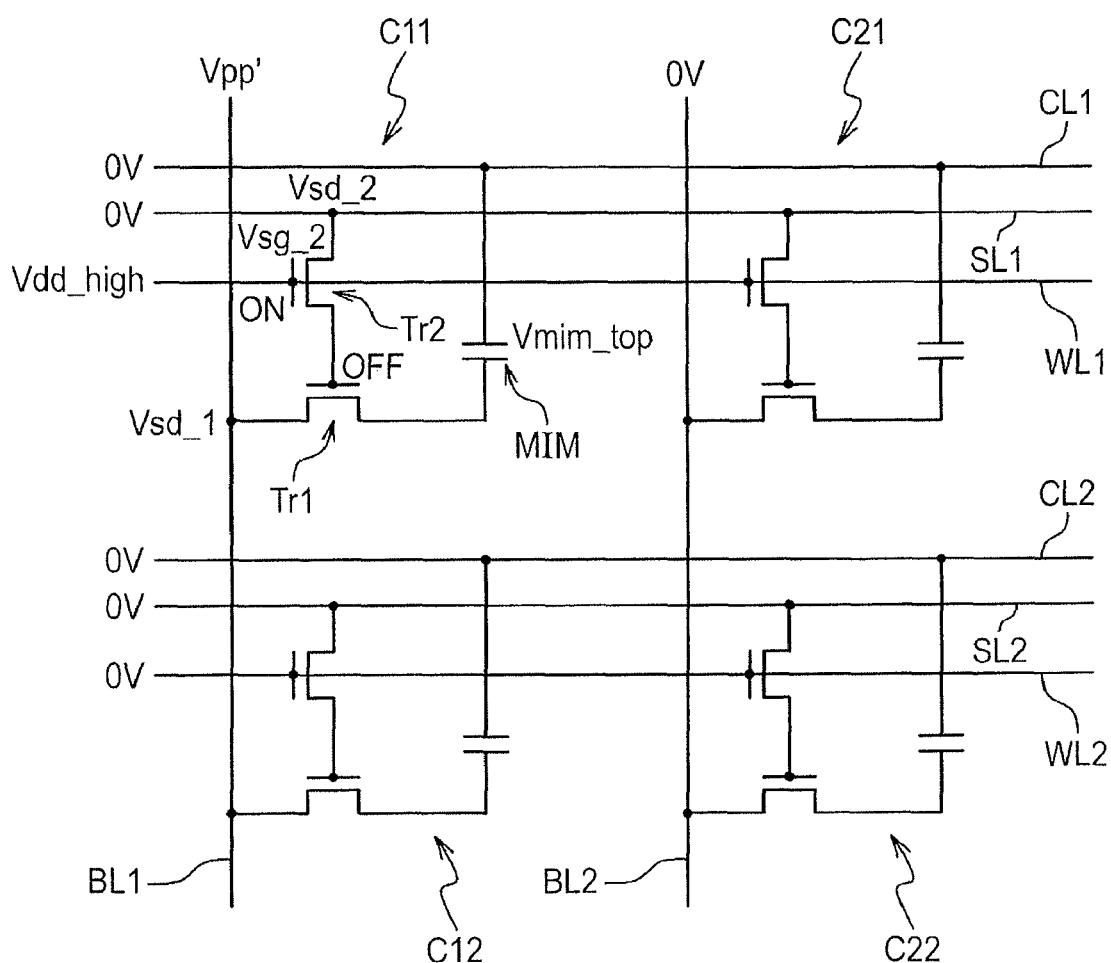
FIG. 5 shows an array configuration and voltage relations at the time of writing of a memory in an embodiment.

Next, an operation method of the OTP memory in the embodiment will be described. FIG. 5 shows an array configuration of a memory in the embodiment and voltage relations at the time of writing. The top plate 16 of the capacitor MIM is coupled to a constant voltage source of 0V via capacitor lines CL1 and CL2 and the drain diffusion layer 10 of the second selection transistor is coupled to the constant voltage source of 0V via sub word lines SL1 and SL2. In the cell C11, since the potential of the drain diffusion layer 6 of the first selection transistor Tr1 is Vpp', and the potential of the gate 12 of the second selection transistor Tr2 is Vdd_high, information "1" is written.

In the cell C21, since Vpp' is not applied to the drain of the first selection transistor Tr1, the gate insulating film 7 does not deteriorate, and "0" is maintained. In the cell C12, the gate potential of the second selection transistor Tr2 is 0V and stress current does not sufficiently flow via the second selection transistor Tr2, so that the gate insulating film 7 does not deteriorate. In the cell C22, since both of the gate potential of the second selection transistor Tr2 and the drain potential of the first selection transistor Tr1 are 0V, the gate insulating film 7 does not deteriorate and "0" is maintained. By controlling the word lines WL1 and WL2 and the bit lines BL1 and BL2 as described above, data "1" can be selectively written only in a desired cell.

Figure 6:
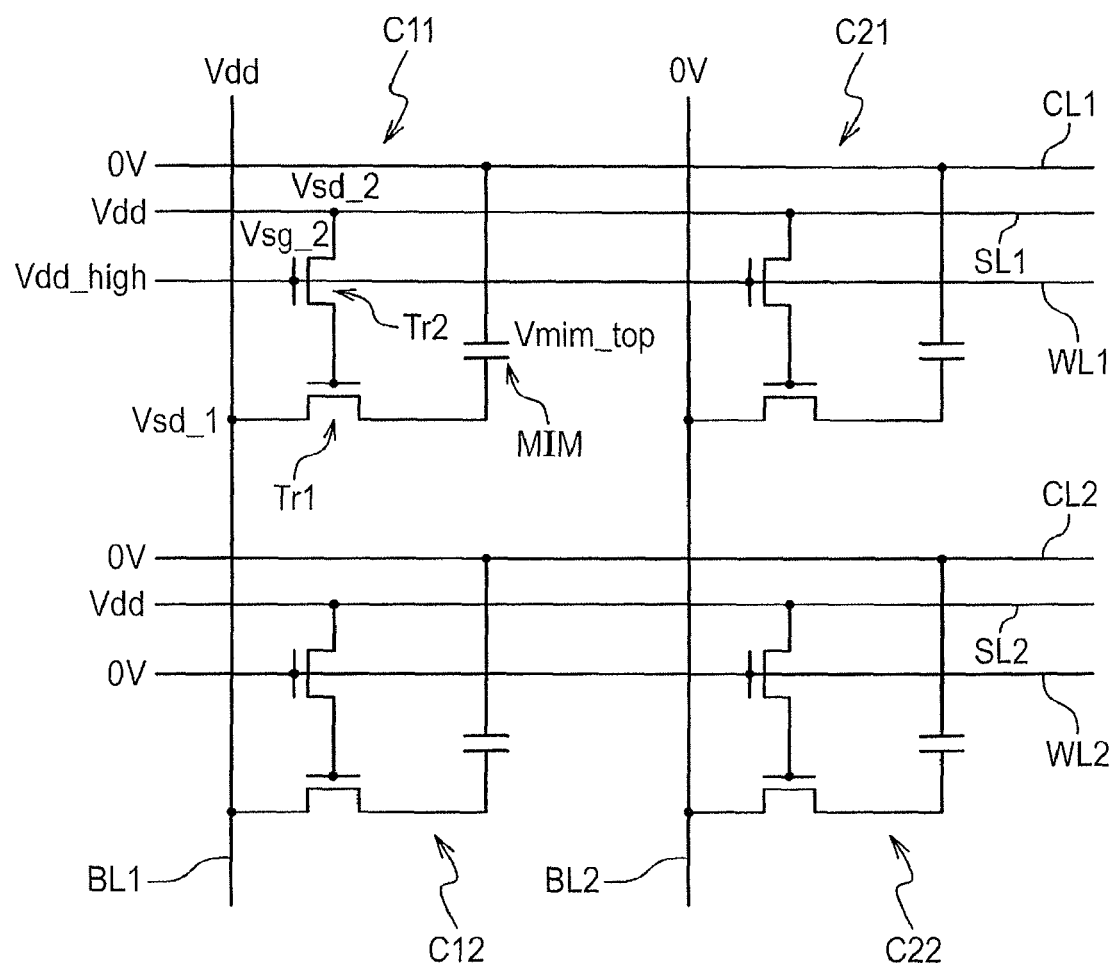
FIG. 6 shows a voltage relation (precharge state) at the time of first reading in an embodiment.

FIG. 6 shows a first example of the voltage relations at the time of reading in the embodiment. In the state of FIG. 6, the capacitors MIM in all of the cells are precharged. In the cell C11, the drain voltage of the first selection transistor Tr1 is charging potential Vdd (for example, about 1V) smaller than Vpp', the gate and drain potentials of the second selection transistor Tr2 are Vdd_high and Vdd, respectively, and the top plate potential of the capacitor MIM is 0V. By such an operation, the capacitor MIM in the designated memory cell C11 can be precharged.

Figure 7:
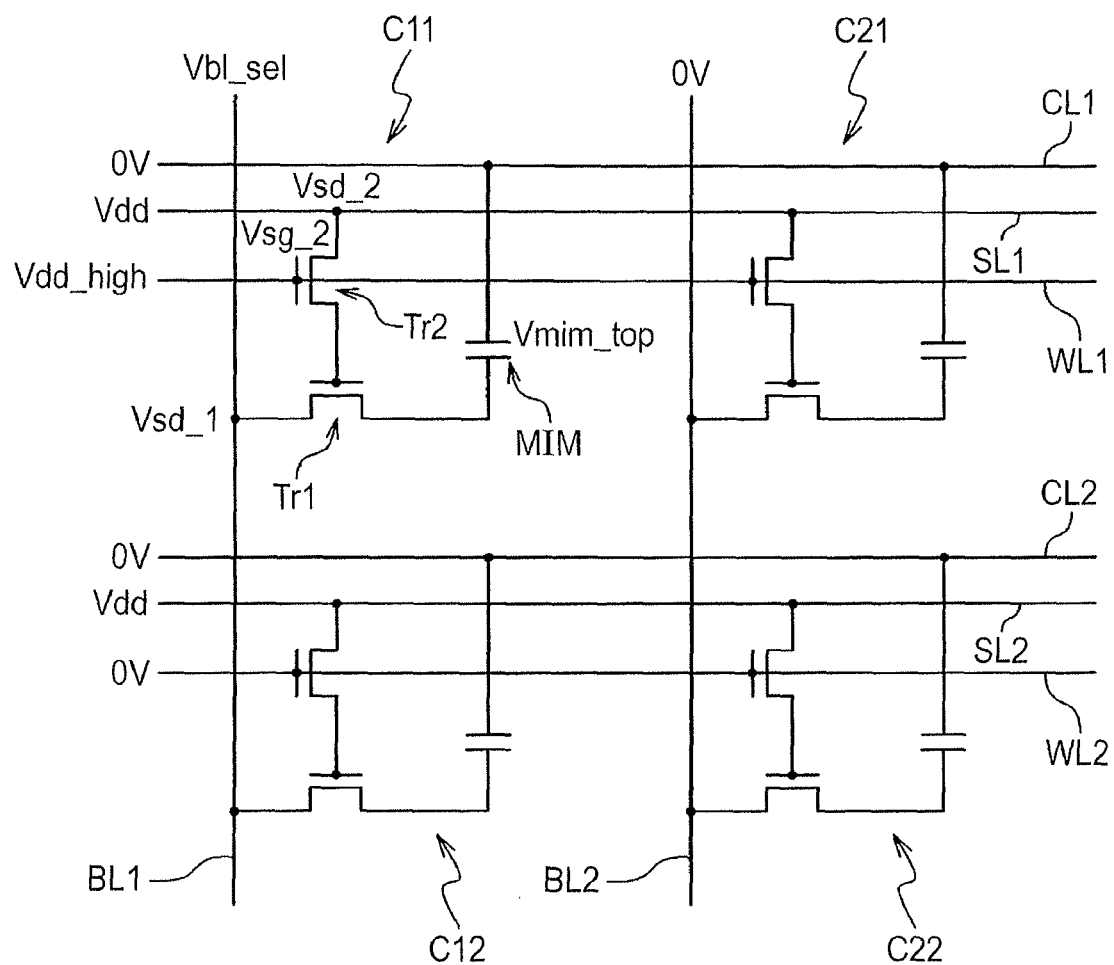
FIG. 7 shows a voltage relation (voltage sense state) at the time of first reading in the embodiment.

After that, the potential accumulated in the capacitor MIM is sensed via the first selection transistor Tr1. As a result, as shown in FIG. 7, a selected bit line voltage Vb1_sel is generated in a bit line (selected bit line) of the cell C11 and output to a sense amplifier. As a result, the data of the cell C11 is read.

In the cell C21, since the drain potential of the first selection transistor Tr1 is 0V, the accumulated potential cannot be sensed. In the cell C12, since the gate potential of the second selection transistor Tr2 is 0V, and the first selection transistor Tr1 is open, the accumulated potential cannot be sensed. In the cell C22, since both of the drain potential of the first selection transistor Tr1 and the gate potential of the second selection transistor Tr2 are 0V, the accumulated potential cannot be sensed. Therefore, only data stored in a desired cell can be selectively read.

In the case where it takes some time to sufficiently discharge the capacitor MIM in a cell in which the gate leak current increases like the cell C11, by preliminarily registering a threshold of reading time in the controller of the OTP memory and sensing the selection bit line voltage Vb1_sel after lapse of the threshold time since start of the reading operation, data can be read reliably.

Figure 8:
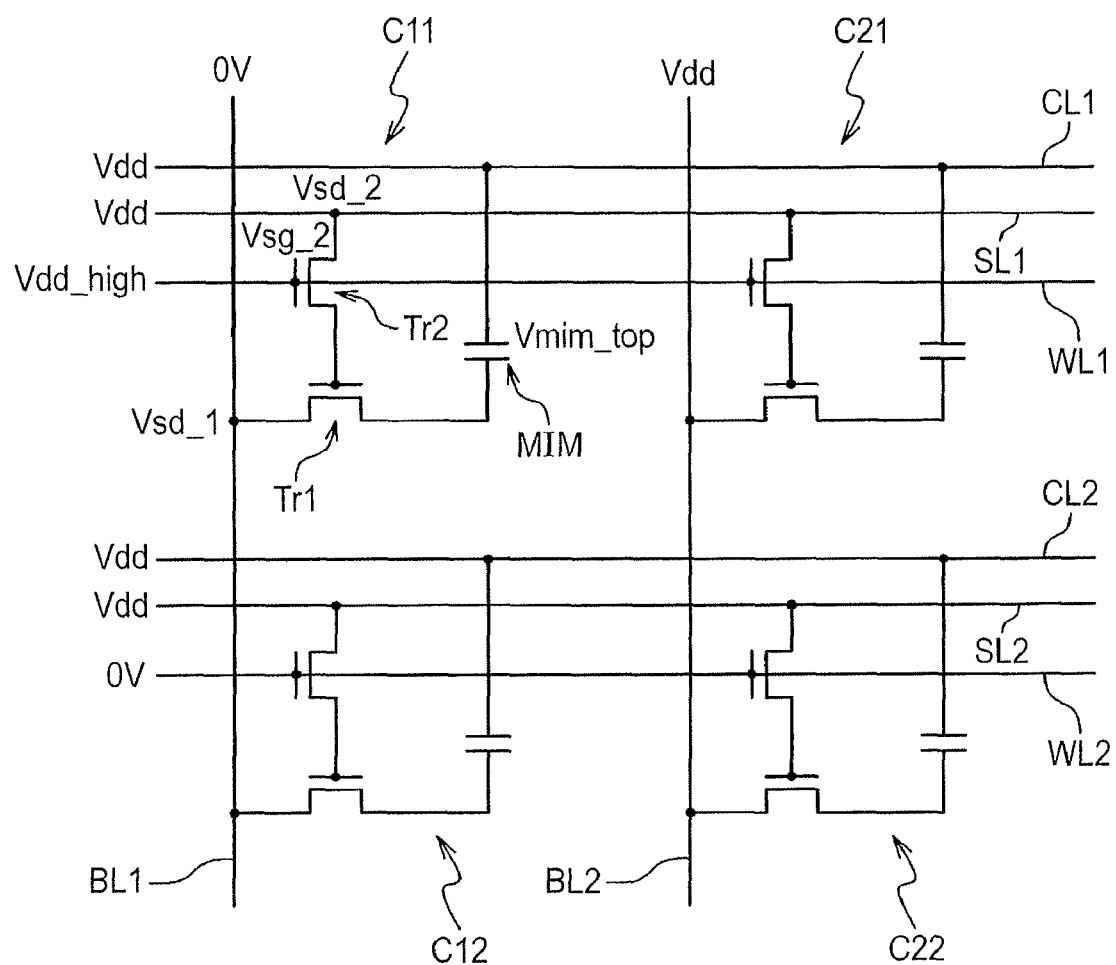
FIG. 8 shows a voltage relation at the time of second reading in the embodiment.

FIG. 8 shows a second example of the voltage relations at the time of reading in the embodiment. In the cell C11, the drain potential of the first selection transistor Tr1 is 0V, the gate and drain potentials of the second selection transistor Tr2 are Vdd_high and Vdd, respectively, and the top plate potential of the capacitor MIM is Vdd. In this case, the bottom plate potential of the capacitor MIM is 0V, the accumulated potential in the top plate is sensed and read.

In the cell C21, the drain potential of the first selection transistor Tr1 is Vdd. 0V, the Therefore, the bottom plate potential of the capacitor MIM becomes the same as the top plate potential, so that the accumulated potential cannot be sensed. In the cell C12, since the gate potential of the second selection transistor Tr2 is 0V, the first selection transistor Tr1 is open, and the bottom plate of the capacitor MIM is in a floating state, the accumulated potential cannot be sensed. In the cell C22, since the drain potential of the first selection transistor Tr1 is Vdd and the gate potential of the second selection transistor Tr2 is 0V, the accumulated potential cannot be sensed. Therefore, only data stored in a desired cell can be selectively read.

In such an OTP memory, the position of leakage in the gate oxide film as a change point when the data "1" is written cannot be determined by a physical analysis. Therefore, a cell in which data "0" is maintained and a cell in which data "1" is written cannot be discriminated by a physical analysis. It is consequently difficult to decode confidential information, and the OTP memory having high confidentiality is realized.

Figure 9:
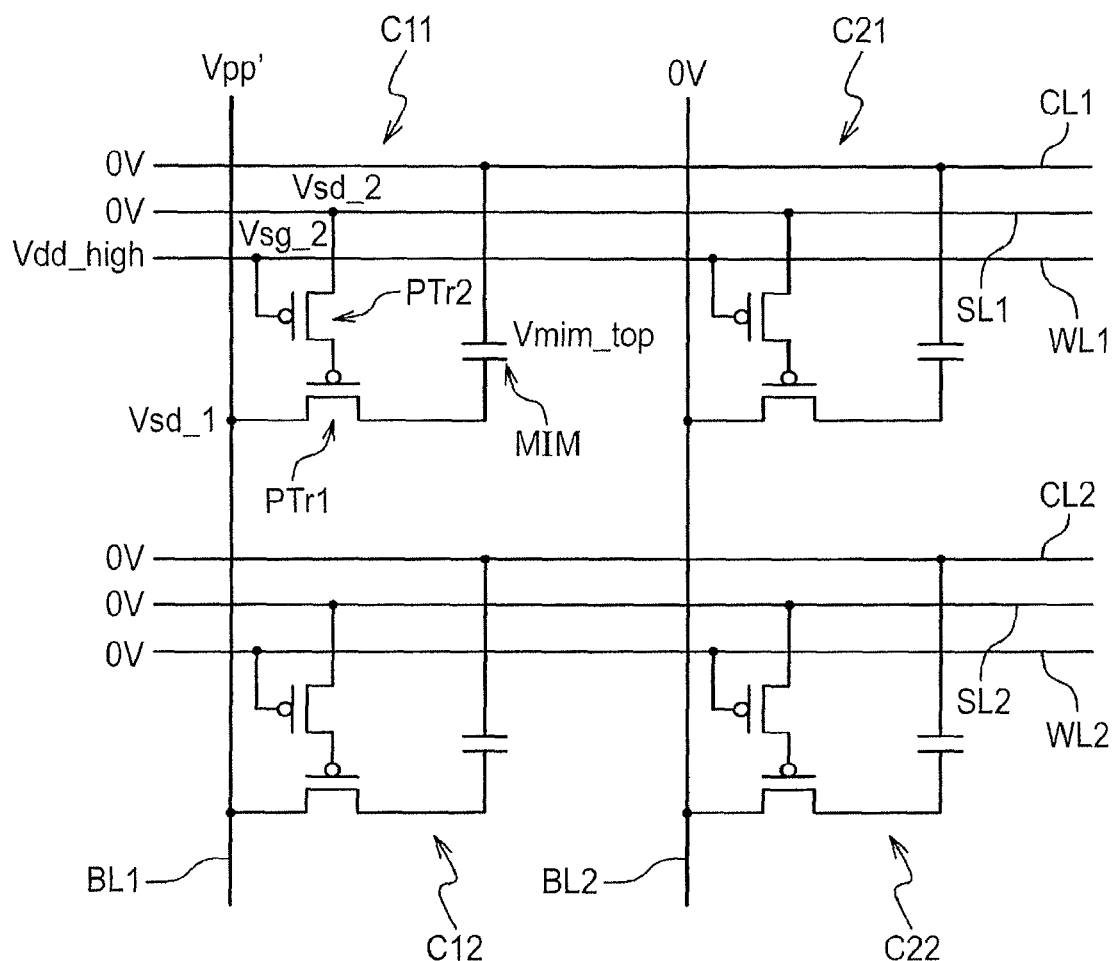
FIG. 9 shows an array configuration of an OTP memory cell.

In the above description, NMOS transistors are used as the first and second selection transistors Tr1 and Tr2. A similar OTP memory can be configured also by using PMOS transistors. FIG. 9 shows an array configuration of such an OTP memory. In this case, as the high voltages Vpp' and Vdd_high used for writing, negative voltages of the signs opposite to those in the case of NMOS transistors are used.

Figure 10:
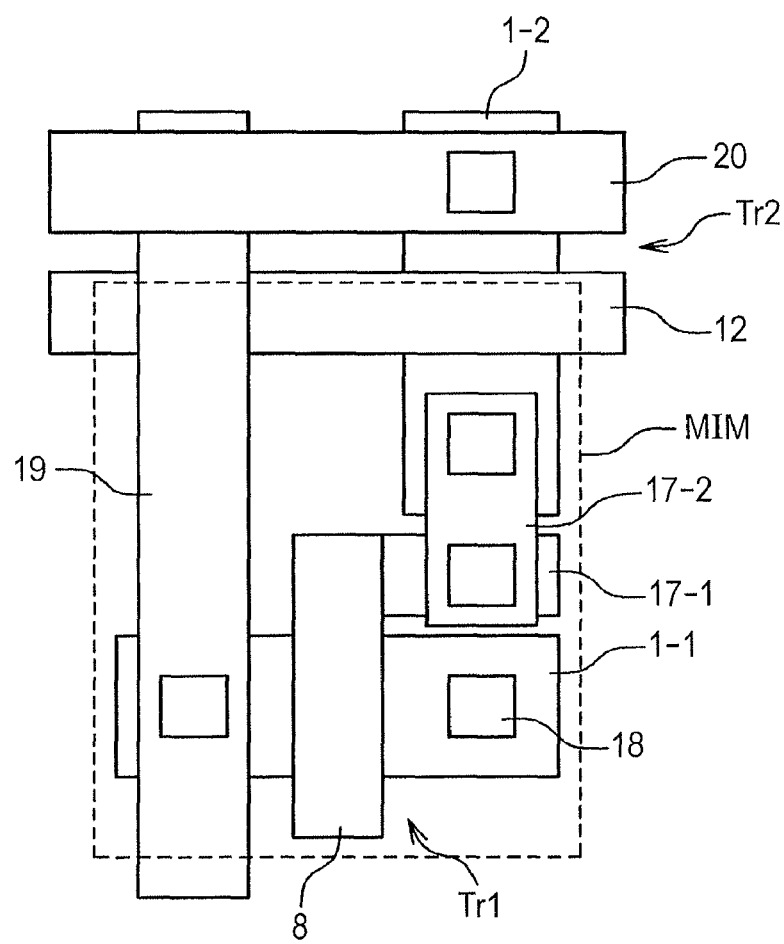
FIG. 10 shows layout of the OTP memory cell.
Figure 11:
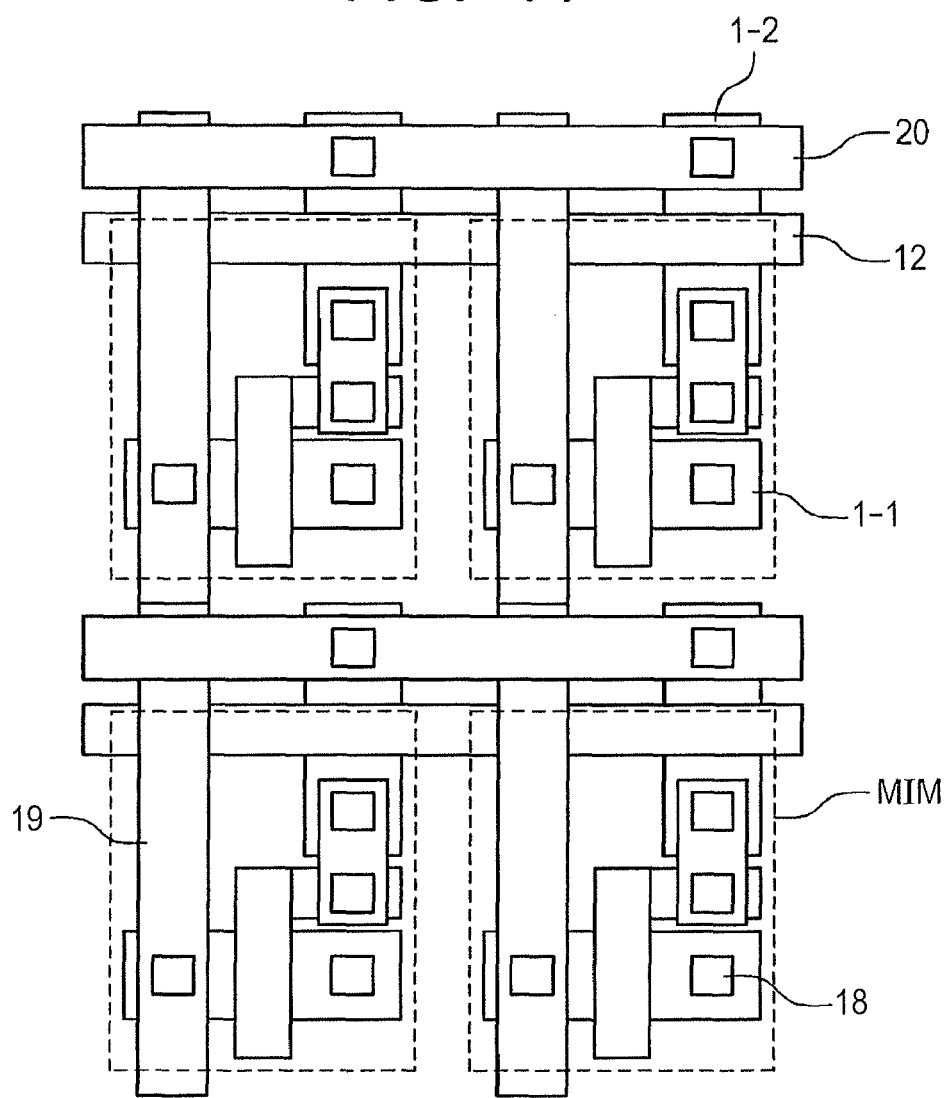
FIG. 11 shows layout of a cell array.

FIG. 10 is a plan view showing layout of the OTP memory cell in the embodiment. FIG. 11 shows layout of a cell array of two columns and two rows. The capacitor MIM is disposed over not only the first selection transistor Tr1 but also the second transistor Tr2. With such layout, the capacitance value of the capacitor MIM can be increased, and reliability of written data is improved.

Diffusion layers 1-1 and 1-2 are formed in a substrate 1 and show the region of the first selection transistor Tr1 side and the region of the second selection transistor Tr2 side, respectively, of a P well isolated by an element isolation region 2 in FIG. 4. The gate 8 of the first selection transistor Tr1 is coupled to the source diffusion layer of the second selection transistor Tr2 via a contact plug corresponding to the line 17 in FIG. 4 and lines 17-1 and 17-2. The drain diffusion layer 6 of the first selection transistor TR1 is coupled to a first metal line 19 via the contact plug. The first metal line 19 serves as a bit line. The source diffusion layer of the first selection transistor Tr1 is coupled to the bottom plate 14 of the capacitor MIM formed in the uppermost layer in the circuit configuration shown in the diagram.

The gate 12 of the second selection transistor Tr2 serves as a word line. The drain diffusion layer 10 of the second selection transistor Tr2 is coupled to a second metal line 20 via a contact plug. The second metal line 20 functions as the sub-word lines SL1 and SL2 shown in FIGS. 5 to 7.

FIGS. 12 to 16 are cross sections showing process of manufacturing a semiconductor device on which the OTP memory in the embodiment is mounted. In the semiconductor device, a memory cell 21 configuring the OTP Memory and a control circuit 22 as a peripheral circuit for driving the memory are formed.

Figure 12:
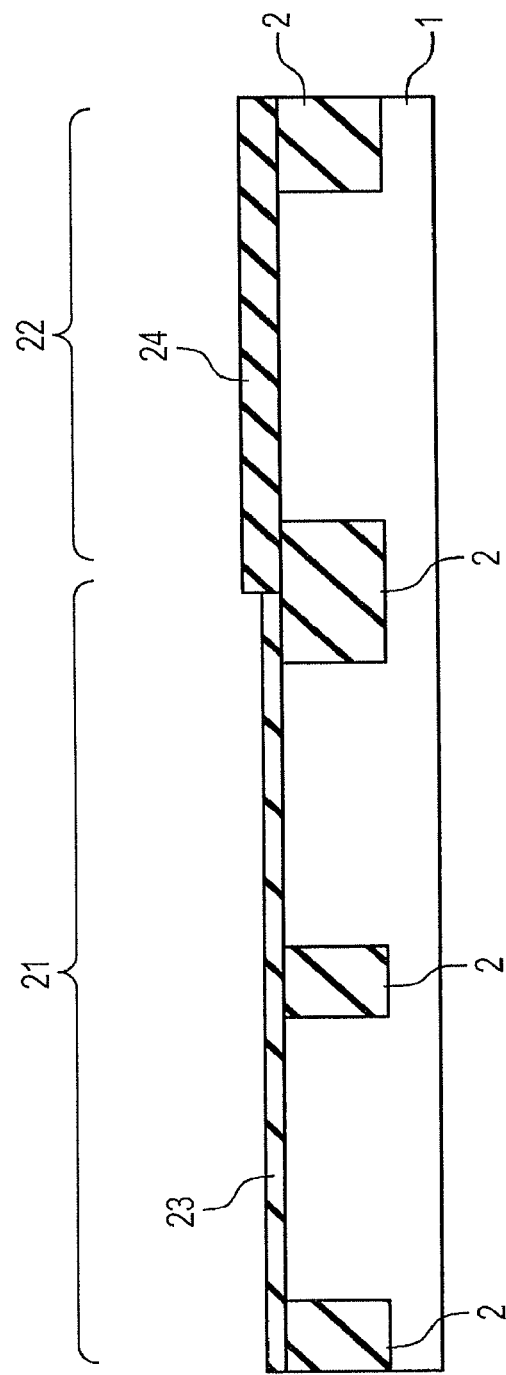
FIG. 12 shows a process of manufacturing a semiconductor device.

As illustrated in FIG. 12, a P well is formed in the substrate 1. By forming the element isolation regions 2 in the substrate 1, the P well is divided into a plurality of regions. On the substrate 1, an insulating layer as a gate insulating film is formed. In the control circuit 22, a thick gate insulating film 24 (having a thickness of, for example, 5 nm or thicker, typically, about 8 nm) is formed. In the memory cell 21, a thin gate insulating film 23 thinner than the thick gate insulating film 24 and having a thickness of, for example, about 2 nm is formed.

Figure 13:
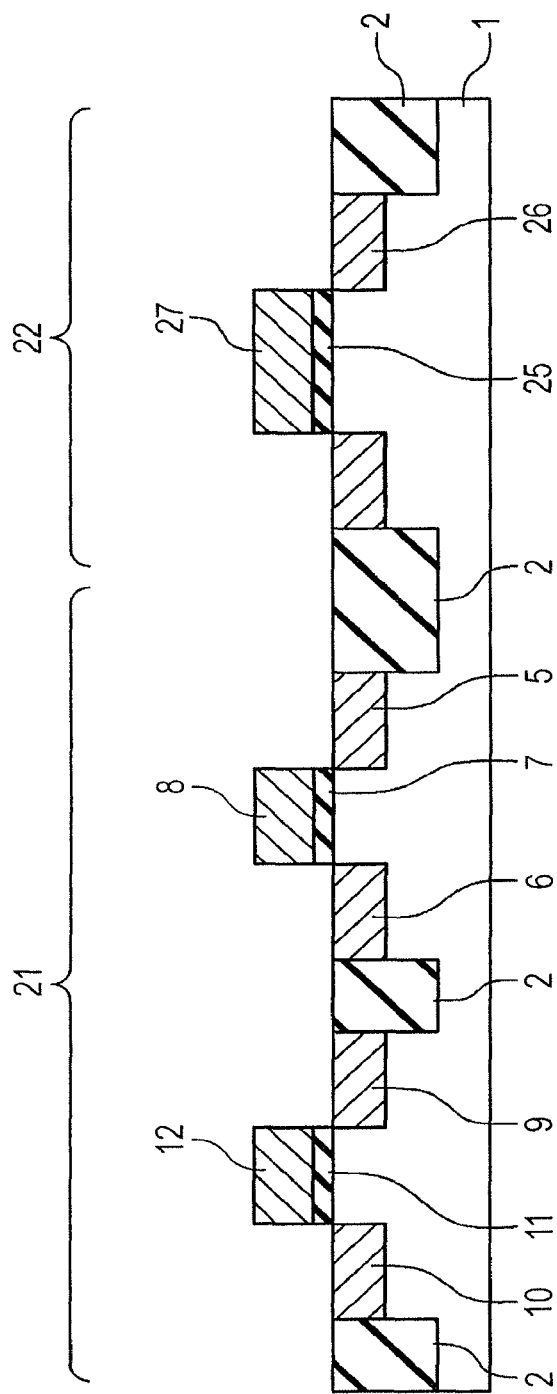
FIG. 13 shows a process of manufacturing the semiconductor device.

As shown in FIG. 13, a layer serving as a gate electrode is formed on the thin gate insulating film 23 and the thick gate insulating film 24. By forming the gate insulating film and the gate electrode in the shapes of elements by photolithography or the like, the gate insulating film 7 and the gate 8 of the first selection transistor Tr1, the gate insulating film 11 and the gate 12 of the second selection transistor Tr2, and a gate insulating film 25 and a gate 27 of the control circuit 22 are formed. In correspondence with the gates, diffusion layers necessary for forming the elements (the source diffusion layer 5, the drain diffusion layer 6, the source diffusion layer 9, the drain diffusion layer 10, and the like shown in FIG. 4 and a diffusion layer 26 in the control circuit 22) are formed in the substrate 1.

Figure 14:
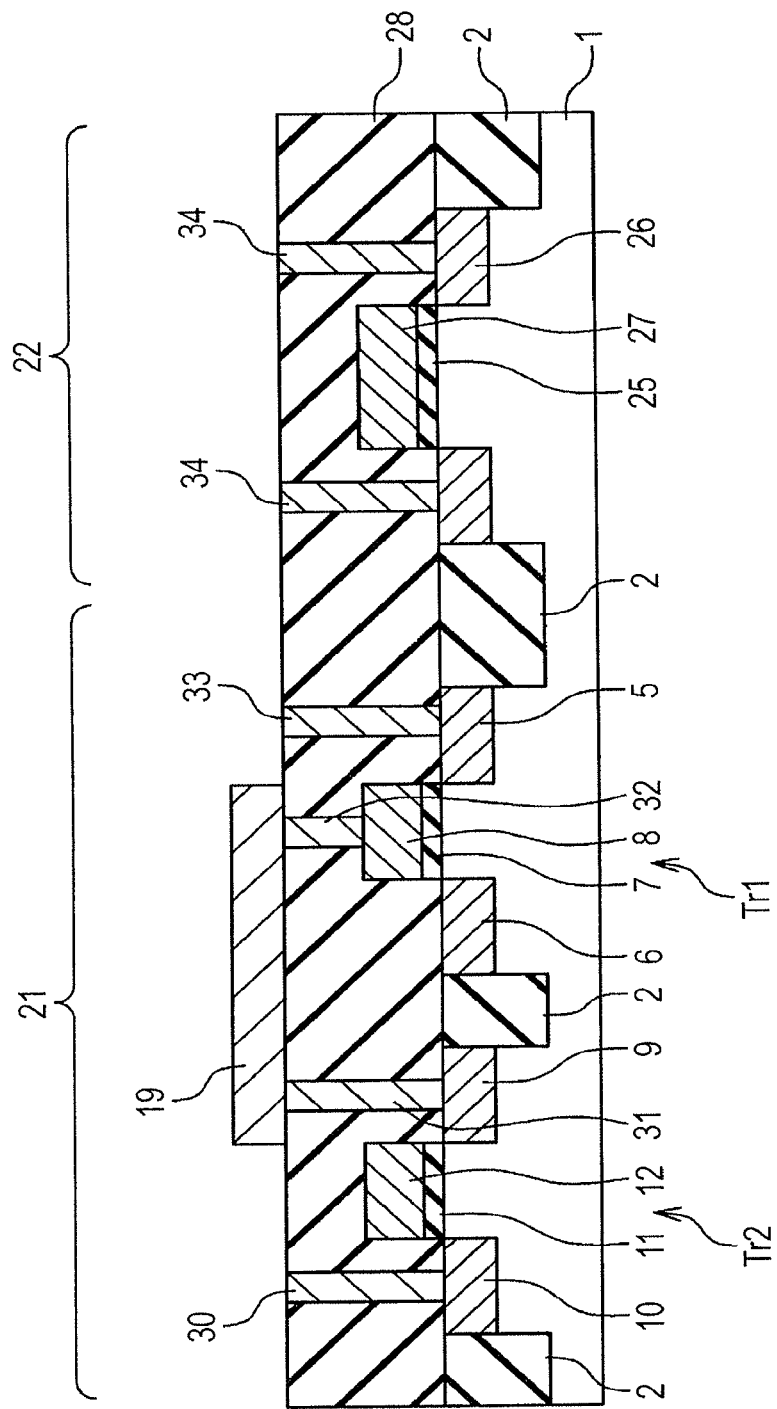
FIG. 14 shows a process of manufacturing the semiconductor device.

As shown in FIG. 14, after formation of the source/drain diffusion layers, a first interlayer insulating film 28 is formed. In the first interlayer insulating film 28, first contact plugs 30, 31, 33, and 34 are formed so as to be coupled to the source/drain diffusion layers of the elements. Further, a first contact plug 32 coupled to the gate 8 of the first selection transistor Tr1 is also formed. The first metal line 19 is formed on the first interlayer insulating film 28 in order to electrically couple the first contact plug 32 and the contact plug 31 coupled to the source diffusion layer 9 of the second selection transistor Tr2 so that the plugs become nodes of the same potential.

Figure 15:
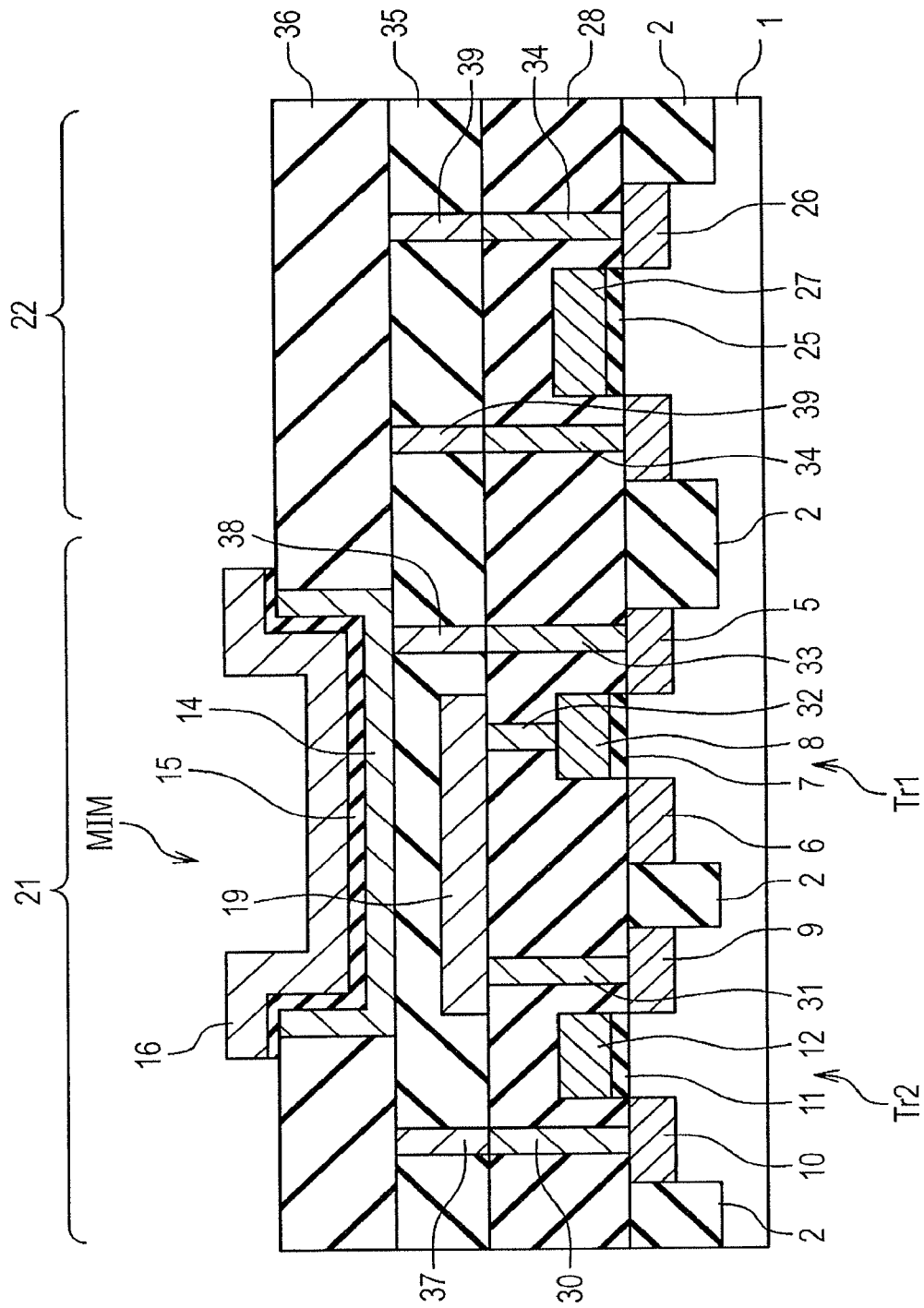
FIG. 15 shows a process of manufacturing the semiconductor device.

As shown in FIG. 15, a second interlayer insulating film 35 is formed on the first interlayer insulating film 28. Second contact plugs 37, 38, and 39 are formed in a second interlayer insulating film 35 so as to be coupled to the contact plugs 30, 33, and 34, respectively. On the second interlayer insulating film 35, a third interlayer insulating film 36 is formed. A predetermined region in the third interlayer insulating film 36 is etched to the surface height of the second interlayer insulating film 35, and the capacitor MIM is formed by process similar to that for a general DRAM (Dynamic RAM) capacitor. Concretely, the bottom plate 14 is formed so as to be coupled to the second contact plug 38. By forming the capacitive insulating layer 15 and the top plate 16 on the bottom plate 14, the capacitor MIM is formed. In the example of FIG. 15, the capacitor MIM is formed in a region overlapping with not only the first selection transistor Tr1 but also the second selection transistor Tr2 in the plan-view layout.

Figure 16:
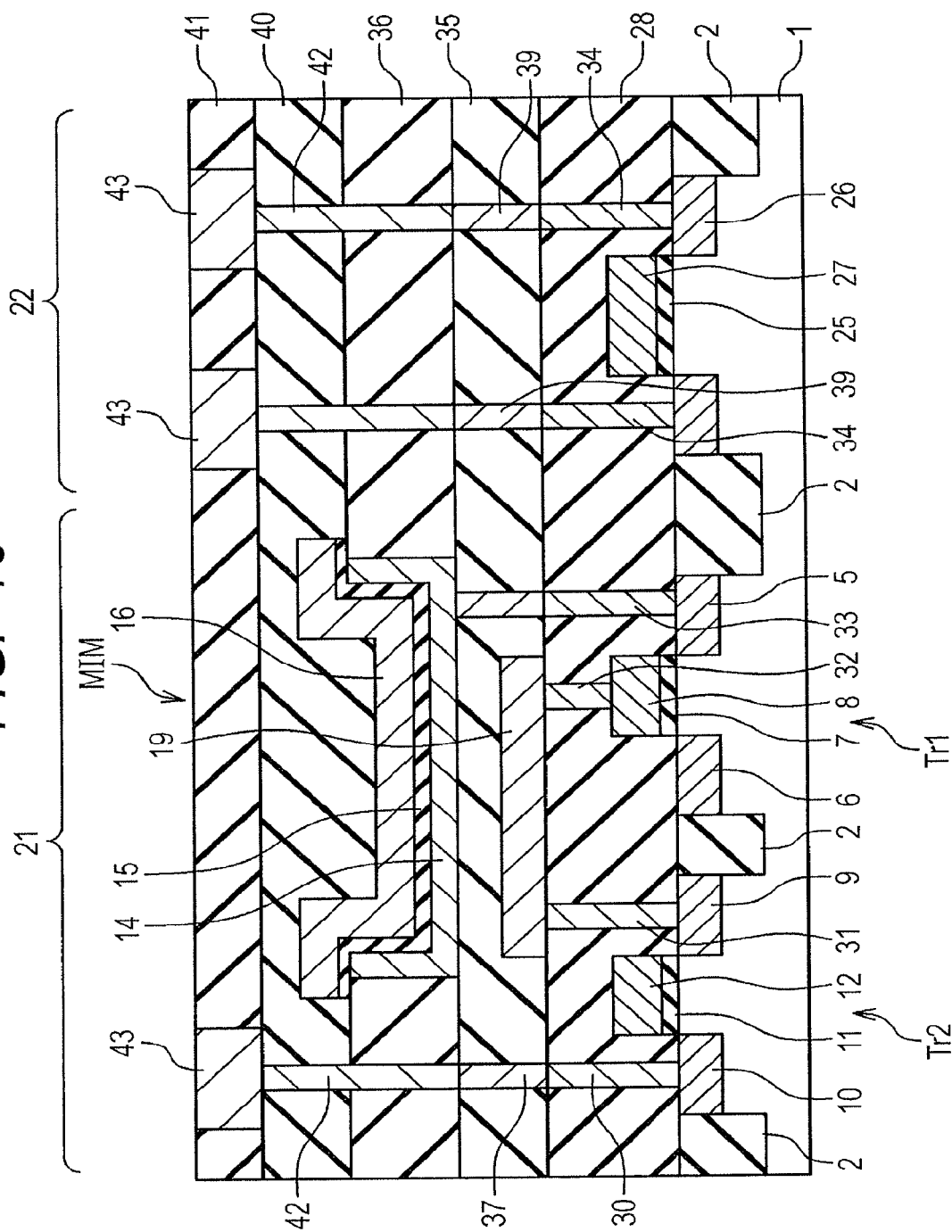
FIG. 16 shows a process of manufacturing the semiconductor device.

As illustrated in FIG. 16, a fourth interlayer insulating film 40 is formed on the third interlayer insulating film 36. Third contact plugs 42 coupled to the second contact plugs 37 and 39 are formed so as to penetrate the third interlayer insulating film 36 and the fourth interlayer insulating film 40. On the fourth interlayer insulating film 40, a fifth interlayer insulating film 41 is formed. In a fifth interlayer insulating film 41, second metal lines 43 are formed so as to be coupled to the third contact plugs. By the above-described processes, a semiconductor device having the OTP memory in the embodiment is manufactured.

What is claimed is:

1. A memory cell for an OTP (One Time Programmable) memory, comprising:
   a first Metal-Insulator-Semiconductor (MIS) transistor comprising a first source region, a first drain region and a first gate; and forming a first current path between the first source region and the first drain region in accordance with voltage applied to the first gate;
   a second MIS transistor comprising a second source region, a second drain region and a second gate, and forming a second current path between the second source region and the second drain region in accordance with voltage applied to the second gate, the second source region being coupled to the first gate of the first MIS transistor via a first line; and
   a capacitor comprising a first electrode and a second electrode, the first electrode coupled to the first source region.

2. The memory cell of claim 1, wherein the first and second MIS transistor are p-type MIS transistors.

* * * * *